United States Patent

[11] 3,622,385

[72] Inventor Fritz W. Stork
Kappmannsgrund, Germany
[21] Appl. No. 746,190
[22] Filed July 19, 1968
[45] Patented Nov. 23, 1971
[73] Assignee Hughes Aircraft Company
Culver City, Calif.

[54] METHOD OF PROVIDING FLIP-CHIP DEVICES WITH SOLDERABLE CONNECTIONS

3 Claims, 3 Drawing Figs.

[52] U.S. Cl. .......... 117/217, 117/107, 117/227, 317/234 M
[51] Int. Cl. .......... B44d 1/14, B44d 1/18
[50] Field of Search .......... 117/217, 107, 227; 317/234 (5.3)

[56] References Cited

UNITED STATES PATENTS

| | | | |
|---|---|---|---|
| 3,290,570 | 12/1966 | Cunningham et al. | 317/234 (5.3) |
| 3,409,809 | 11/1968 | Diehl | 317/234 (5.3) |
| 3,419,765 | 12/1968 | Clark et al. | 317/234 (5.3) |
| 3,429,029 | 2/1969 | Langdon et al. | 317/234 (5.3) |
| 3,436,614 | 4/1969 | Hiroshi Nagatsu et al. | 317/234 (5.3) |

*Primary Examiner*—Alfred L. Leavitt
*Assistant Examiner*—C. K. Weiffenbach
*Attorneys*—James K. Haskell and W. H. McAllister, Jr.

ABSTRACT: Method of providing flip-chip devices having aluminum connection means with solderable connections by applying "fresh" aluminum on the existing aluminum means and then in the same vacuum depositing nickel or nickel-chrome on the "fresh" aluminum and a solderable metal (copper or gold) onto the nickel (or nickel-chrome).

INVENTOR
FRITZ W. STORK,
BY
W. H. MacAllister Jr
ATTORNEY

METHOD OF PROVIDING FLIP-CHIP DEVICES WITH SOLDERABLE CONNECTIONS

This invention relates to the manufacture and assembly of solid-state electronic components and microcircuits particularly but not necessarily exclusively of the monolithic type. More specifically, the invention relates to methods and materials for mounting monolithic circuit or device chips onto headers or circuit boards or substrates by "flip-chip" reflow soldering techniques.

The terms "monolithic integrated circuit" or "monolithic device" refer to an electronic circuit or device which is complete in or on a single piece of semiconductor material generally referred to as a "chip." The circuit or device is usually protected from the ambient by a covering of electrically insulating material except where metalized areas are exposed or provided for the purpose of making electrical connections to the circuit or device. Such electrical connections are usually provided on only one surface of the chip which may then be mounted onto a support substrate or header or a printed circuit board by "flipping" the chip over so as to be face down, for example, on the substrate with the metalized connection areas thereof in contact with the desired electrical terminals or connections on the substrate and to which the chip may be permanently joined or bonded. This mounting technique, which has come to be known as the "flip-chip" procedure, permits the attachment of monolithic chips to substrates in one simple operation without the necessity for bonding wires and with very little spacing between chips, thus permitting the attainment of high-density arrays. The absence of wires and the simplicity of removing and rebonding a chip, particularly where solder-type bonds can be employed, makes circuit repairability not only possible but quick and inexpensive. Reliability is also enhanced since the absence of bonded wires eliminates the greatest source of failure.

Very high strength bonds can be achieved between the chip and the substrate by a bonding technique known as reflow soldering which results in the formation of strong, continuous metallurgical bonds. To achieve such metallurgical bonds it is necessary that the metals forming these bonds must melt or flow (or, more properly, undergo what is known as "plastic deformation"). Many of the monolithic circuit or device chips available from manufacturers today, however, are provided with aluminum connection areas or means. It is well known that aluminum is not a metal which is readily solderable, primarily because of the aluminum oxide skin which readily forms on almost all aluminum parts upon exposure to the ambient. This aluminum oxide prevents the necessary molten metal-to-metal contact required for the formation of strong metallurgical bonds. To obtain bonds to aluminum surfaces generally requires the use of high temperatures and high mechanical forces in an effort designed to break through or penetrate the aluminum oxide skin. The "breakthrough" is often very spotty so that bonding is not substantially continuous but is exceptionally haphazard. Hence, heretofore it has not been possible to provide reliable and strong electrically conductive bonds between chips and support substrates with aluminum metallurgy utilizing the flip-chip technique primarily because this technique does not permit the attainment of the high temperatures and mechanical forces required for good aluminum bonding.

It is therefore an object of the present invention to provide an improved method for mounting semiconductor components such as monolithic device and integrated circuit chips on a substrate support.

Another object of the invention is to provide an improved method for attaching monolithic integrated circuit or device chips to a support substrate by metallurgical bonds of high bond strength.

Yet another object of the invention is to provide an improved method for bonding monolithic circuit or device chips to a support substrate by soldering techniques notwithstanding the fact that either the chip or support substrate may be initially provided with aluminum or other nonsolderable metalized connection means.

These and other objects and advantages of the invention are achieved by providing in vacuum the aluminum connection areas with a "fresh" aluminum surface and then, while maintaining the vacuum, depositing nickel-chrome or nickel. It has been found that if these three metal layers are deposited in a single vacuum run, adherence to each other without interfacial characteristics is excellent. The nickel-chrome or the nickel is necessary in order to isolate the copper or gold from the aluminum since the direct deposition of copper or gold onto aluminum results in a reaction therebetween which produces not only mechanically poor but electrically unsatisfactory connections and bonds. No such reactions are involved when nickel-chrome or nickel is deposited onto aluminum and copper or gold is deposited onto the nickel-chrome or nickel. The copper or gold is readily solderable as to raised contacts such as silver bumps, for example, which may be provided with a tin coating. In order to avoid oxidation of the copper or to protect the gold in the soldering operation against its high solubility in tin-clad silver bumps, silver may be plated onto the copper or gold. It is also possible to provide the tin-clad silver bumps on the copper or gold connection areas on the flip, if desired, rather than on the substrate.

The invention will be described in greater detail with reference to the drawings in which.

Figure 1:
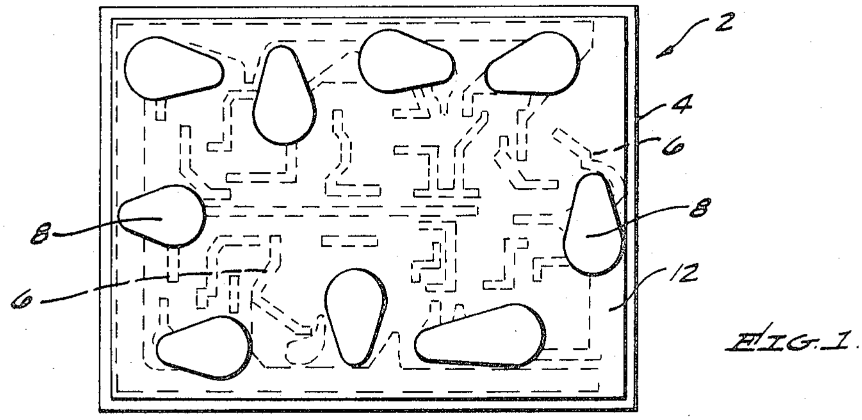
FIG. 1 is a plan view of a typical monolithic integrated circuit chip initially provided with aluminum connection areas.
Figure 2:
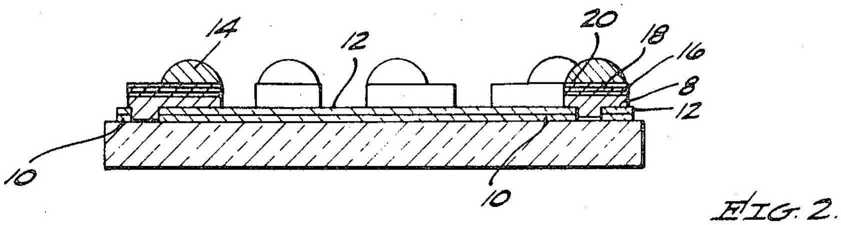
FIG. 2 is a cross-sectional, elevational view of the monolithic chip shown in FIG. 1 after processing according to the method of the invention.

Referring now to FIGS. 1 and 2, a monolithic integrated circuit chip 2 is shown comprising a support substrate 4 of silicon, for example, in which have been fabricated a plurality of electrical elements or components (not shown) such as transistors, diodes and resistors, for example. Typically, this circuit chip may be a shift register circuit. Disposed on the surface of the silicon chip 4 is a plurality of electrical leads 6 connected to the various electrical elements and devices and terminated in relatively large area connection members or "-pads" 8 whose purpose is to permit electrical connection to be made to the circuit chip and the various electrical elements and devices thereof. More specifically, the leads 6 may be in the form of vacuum-deposited strips or areas of metal disposed on and bonded to an underlying coating 10 of electrically insulating material, such as silicon dioxide, which strips or areas also extend through openings in the insulating coating 10 to make electrical contact with the various terminals of the various electrical devices constituting the circuit chip. Disposed over the leads 6 as well as over the oxide insulating layer 10 is a layer 12 of electrically insulating material such as glass, for example, which protects the chip from the ambient. Through openings in the glass layer 12 portions of the underlying leads 6 are exposed.

As indicated above, the connection pads 8 may be in the form of vacuum-deposited areas of metal disposed on the glass layer 12 which extend through the openings in the glass layer to make electrical contact with the portions of the leads 6 exposed in such openings. As noted hereinbefore, it is customary to utilize aluminum as the metal for the connection pads 8. Thus, as presented to the customer or user, such a monolithic circuit chip has an upper surface comprising aluminum metal areas 8 and areas 12 of electrically insulating material e.g., glass) and all that remains to permit the circuit to be operated is to make the desired electrical connections thereto via the connection pads 8. To permit such utilization the chip is mounted on some type of support substrate such as a printed circuit board or circuit module. It has been customary to accomplish such mounting and connection by means of aluminum-to-aluminum bonds utilizing the aluminum connection pads 8 on the circuit chip. Because of the great difficulty of obtaining metallurgical bonds of substantial extent to aluminum, the bonding techniques of the prior art for such monolithic integrated circuit or device chips have not resulted in reliable bonds of high strength.

Figure 3:
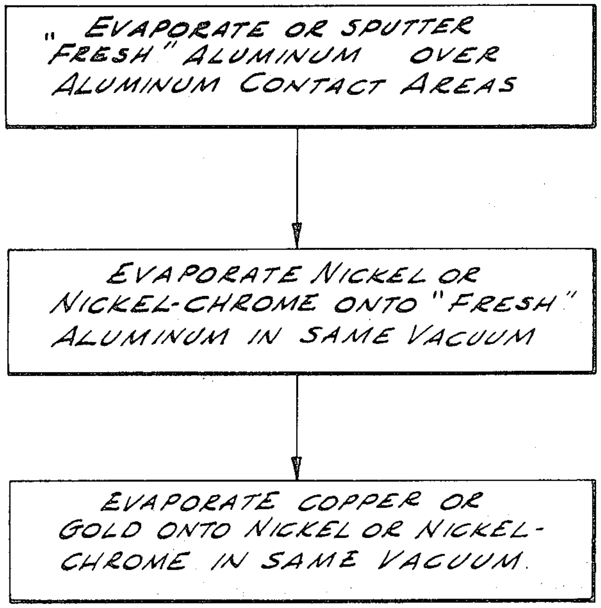
FIG. 3 is a diagrammatic flow chart of the principal steps of the method of the invention.

With specific reference now to FIGS. 2 and 3, the method of the invention solves this difficulty and permits the bonding of such monolithic flip-chip circuits or devices by soldering techniques so as to achieve strong, substantially continuous metallurgical bonds of relatively large area (that is, over substantially the entire area of the connection means or pads 8). In order to obtain such bonds it is necessary to convert the connection pads 8 to a solderable metal such as copper or gold. It has, however, been found not to be practical to directly apply copper or gold onto contact areas or connection pads 8 of aluminum because of the formation of brittle metallic phases of gold or copper and aluminum which result in mechanical failure of the bond particularly upon cooling. In the case of gold and aluminum, for example, this phase (called "purple plague") is believed to be gold aluminide ($AuAl_2$). It is undesirable to apply copper directly to aluminum because this particular system of copper and aluminum metals is highly susceptible to corrosion phenomena particularly in the presence of moisture. It is therefore necessary to isolate the solderable metal (copper or gold) from the aluminum metal of the contact areas 8 by an electrically conductive material or metal which will make a good bond to aluminum and which will not form such undesirable alloys or phases therewith. Suitable for this purpose is nickel-chrome (80 percent nickel and 20 percent chromium) or nickel alone. It has been found, however, that if these metals are directly deposited upon the aluminum metal of the connection pads 8 poor bonds may still result due to interfacial or intermittent contact between the nickel-chrome or nickel and the aluminum. That is, the aluminum oxide skin is often only erratically penetrated in a multiple pinholelike fashion. It has been unexpectedly found that such poor bonding and metal or metal-oxide interfacial problems do not occur if the nickel-chrome or nickel is vapor deposited onto fresh (unoxidized) aluminum. Hence, the first step according to the process of the invention is to provide the aluminum connection pads 8 with a layer of fresh aluminum after which nickel-chrome or nickel is deposited thereon, followed by the vapor deposition of copper or gold onto the nickel-chrome or nickel layers.

According to the process of the invention a monolithic integrated circuit chip such as shown in FIG. 1 is placed in suitable vapor deposition apparatus which is evacuated. A layer 16 of fresh aluminum is then provided on the aluminum connection pads 8 by evaporating or sputtering aluminum thereon to a thickness of between 6,000–8,000 A. The thickness of the fresh aluminum layer 16 is not critical and is determined primarily by the minimum amount necessary to completely cover the aluminum oxide skin thereon without any pinholes in the metal. In the same vacuum, that is, without removing the flip-chip circuit from the evacuated apparatus, a layer 18 of nickel-chrome or nickel is vapor deposited onto the fresh aluminum layer to a thickness of between 600 and 1,000 A. Again the thickness of this layer is not critical and is determined primarily by the minimum amount necessary to completely cover the fresh aluminum without pinholes. Still in the same vacuum a layer 20 of copper or gold is vapor deposited onto the nickel-chrome or nickel. Again the thickness of the copper or gold is not critical and is dictated by the amount necessary to provide a good solderable and electrically conductive contact area. Because of its excellent solderability properties copper is preferred, particularly if it is protected against oxidation by a thin gold layer. Typically, the copper layer may be about 15,000 A thick and the covering gold layer about 3,000–4,000 A thick. Gold alone may be used providing it is thick enough, which it must be in order to prevent the subsequent soldering operations from dissolving undue amounts of the gold, the gold being particularly susceptible to such dissolution. To prevent excessive dissolving of gold it is, in general, necessary to provide a gold layer about 30,000 A thick. Because it is difficult to evaporate that much gold from a single source or evaporation boat, it is generally preferable to utilize the copper-gold system described previously.

Thus, the contact areas 8 are provided with a metallic surface or coating of copper or gold which is readily solderable. The flip-chip device or circuit can now be soldered as to solderable contacts (which may be raised or in the form of "-bumps") on a support substrate or circuit module utilizing temperatures which result in the actual melting and flowing of the materials constituting the connection pad and the contacts. The contacts or bumps may be of silver, for example.

It may be desirable to provide the copper or gold layers constituting the connection pads 8 with a layer of silver so as to protect the copper against oxidation or to protect the gold against its high solubility in tin, it being customary to employ tin-coated silver bumps as the contact members for mounting. The connection areas or pads 8 may be provided with the desired silver coating by electroplating techniques such as described in the copending application of K. H. Reissmueller et al., Ser. No. 511,780 filed Dec. 6, 1965 now U.S. Pat. No. 3,408,271 and assigned to the instant assignee.

It will be appreciated that the raised contacts or bumps may be provided either on the monolithic chip or upon the substrate or module on which the chip is to be mounted, as indicated in FIG. 2. This may be accomplished by using the silver-plating technique of the aforementioned copending application. Thus, the connection pads 8 may be provided with raised contacts or bumps 14 of silver if desired. The silver bumps 14 may also be tinned by dipping or plating as is well known in the art.

The decision as to whether to provide the bumps on the flip-chips or on the mounting substrate or module may be made any time after the conversion of the connection metallurgy of the chip by the process of the invention. Thus, the process and metallurgy of the invention permit a high degree of flexibility in manufacturing alternatives as well as the achievement of good metallurgical bonds capable of being reflowed or melted which allow for ready and easy repair or replacement of defective chips.

There thus has been shown and described a method for attaching flip-chip devices by solderable, metallurgical bonding techniques.

What is claimed is:

1. The method of providing an electronic device having an aluminum connection means thereon with a solderable connection means comprising the steps of:

a. placing in a vacuum, an electronic device having an aluminum connection means thereon, wherein the surface of the aluminum has acquired a surface layer of aluminum oxide;
b. in vacuum, coating said aluminum connection means with a new layer of aluminum;
c. while maintaining said vacuum, coating said new layer of aluminum with a layer of metal selected from the group consisting of nickel and nickel-chrome alloy;
d. and, while still maintaining said vacuum, coating said last-named layer of metal with a layer of metal selected from the group consisting of copper and gold.

2. The method of providing an electronic device having an aluminum connection means thereon with a solderable connection means comprising the steps of:

a. placing in a vacuum, an electronic device having an aluminum connection means thereon, wherein the surface of the aluminum has acquired a surface layer of aluminum oxide;
b. in vacuum, coating said aluminum connection means with a new layer of aluminum;
c. while maintaining said vacuum, coating said new layer of aluminum with a layer of metal selected from the group consisting of nickel and nickel-chrome alloy;
d. and, while still maintaining said vacuum, coating said last-named layer of metal with successive layers of copper and gold in the order named.

3. The invention according to claim 2 wherein the layer of gold is thin relative to the thickness of the layer of copper.